US008436831B2

(12) United States Patent
Wei et al.

(10) Patent No.: US 8,436,831 B2
(45) Date of Patent: May 7, 2013

(54) CAPACITIVE TOUCH DETECTION SYSTEM AND DETECTION SIGNAL RECEIVING AND WAVEFORM SHAPING MODULE

(75) Inventors: Fu-Cheng Wei, Hsin-Chu (TW); Yu-Min Hsu, Hsin-Chu (TW); Yung-Tse Cheng, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 401 days.

(21) Appl. No.: 12/827,621

(22) Filed: Jun. 30, 2010

(65) Prior Publication Data

US 2011/0063246 A1    Mar. 17, 2011

(30) Foreign Application Priority Data

Sep. 14, 2009 (TW) .............................. 98130956 A

(51) Int. Cl.
*G06F 3/044* (2006.01)

(52) U.S. Cl.
USPC ........................................................ 345/174

(58) Field of Classification Search .................. None
See application file for complete search history.

(56) References Cited

U.S. PATENT DOCUMENTS

| 7,339,570 | B2 | 3/2008 | Kubota et al. | |
| 2007/0257890 | A1* | 11/2007 | Hotelling et al. | ............. 345/173 |
| 2008/0111621 | A1 | 5/2008 | Matthews | |
| 2008/0165134 | A1* | 7/2008 | Krah | ............................. 345/173 |

* cited by examiner

*Primary Examiner* — Joseph Haley
*Assistant Examiner* — Emily Frank
(74) *Attorney, Agent, or Firm* — WPAT, PC; Justin King

(57) ABSTRACT

An exemplary capacitive touch detection system includes a capacitive touch panel and a detection control circuit. The capacitive touch panel includes a plurality of input terminals and output terminals. The detection control circuit includes a scanning signal transmitting module electrically coupled to the input terminals and a detection signal receiving and waveform shaping module including a receiver and an impedance-matching network. The detection signal receiving and waveform shaping module is electrically coupled to the output terminals for receiving and processing a plurality of detection signals outputted from the respective output terminals and thereby producing a plurality of processed detection signals. The receiver is used for receiving the detection signals. The impedance-matching network is used for performing a waveform shaping operation applied to the detection signals to compensate an effect caused by uneven RC loading distribution in the capacitive touch panel and thereby producing the processed detection signals.

7 Claims, 4 Drawing Sheets

CAPACITIVE TOUCH DETECTION SYSTEM AND DETECTION SIGNAL RECEIVING AND WAVEFORM SHAPING MODULE

CROSS-REFERENCE TO RELATED APPLICATIONS

This application is based upon and claims the benefit of priority from the prior Taiwan Patent Application No. 098130956, filed Sep. 14, 2009, the entire contents of which are incorporated herein by reference.

BACKGROUND

1. Technical Field

The present invention generally relates to touch detection technology fields and, particularly to a capacitive touch detection system and a detection signal receiving and waveform shaping module thereof.

2. Description of the Related Art

Referring to FIG. 1, which illustrates a schematic structural diagram of a conventional capacitive touch panel. The conventional capacitive touch panel generally constitutes a capacitive touch detection system cooperatively with a conventional detection control circuit (now shown), and the conventional detection control circuit generally includes a digital controller, a transmitter, a receiver, a voltage amplifier and an analog to digital (A/D) converter electrically coupled to one another in a suitable manner. As illustrated in FIG. 1, the conventional capacitive touch panel 24 includes a plurality of input terminals X1~Xm and a plurality of output terminals Y1~Yn. The detection control circuit generates a scanning voltage signal with particular voltage amplitude (e.g., a square waveform signal as illustrated in FIG. 1). The scanning voltage signal is then inputted into the input terminals X1~Xm of the capacitive touch panel 24 in a double-side driving mode for scanning the whole capacitive touch panel 24. When the capacitive touch panel 24 is in operation, the capacitive touch panel 24 will output a plurality of detection voltages (i.e., generally one type of detection signals) from the respective output terminals Y1~Yn thereof. The detection voltages are sent to the detection control circuit and then processed through the detection control circuit to be a touch detection result as output.

FIG. 2 illustrates waveforms of the detection voltages outputted from the respective output terminals Y1~Yn of the capacitive touch panel 24. As seen from FIGS. 1 and 2, since original RC loading distribution of the capacitive touch panel 24 is uneven, the more near to the middle of the capacitive touch panel 24, the larger of the RC loading, therefore an amplitude of the detection voltage outputted from the middle-most output terminal is minimum (e.g., 70 mV) under the situation of the capacitive touch panel 24 being untouched, and in the double-side driving mode, amplitudes of the detection voltages of the left-most side and right-most side of the capacitive touch panel 24 are maximum (e.g., 380 mV and 360 mV respectively).

When a reference voltage of the analog-to-digital converter in the detection control circuit is set to be a fixed value (e.g., 3.3V), the amplified detection voltages outputted from the voltage amplifier must be lower than 3.3V so that the analog-to-digital converter can discriminate them. If the maximum detection voltage illustrated in FIG. 2 is taken to calculate the magnification of the voltage amplifier and no more than the reference voltage 3.3V of the analog-to-digital converter after being amplified, the magnification is 8. Therefore, the amplified maximum detection voltage is 3.04V and the amplified minimum detection voltage is 0.56V. Because a current absorbed by human body who touching the capacitive touch panel 24 is little, excessive large differences among the amplified detection voltages outputted from the respective output terminals Y1~Yn under the situation of the capacitive touch panel 24 being untouched would not facilitate the digital level discrimination in the analog-to-digital converter 228.

SUMMARY

The present invention relates to a capacitive touch detection system to effectively improve the effect caused by original uneven RC loading distribution in the capacitive touch panel associated with the prior art.

The present invention further relates to a detection signal receiving and waveform shaping module to effectively improve the effect caused by original uneven RC loading distribution in the capacitive touch panel associated with the prior art.

A capacitive touch detection system in accordance with an embodiment of the present invention includes a capacitive touch panel and a detection control circuit. The capacitive touch panel includes a plurality of input terminals and a plurality of output terminals. The detection control circuit includes a scanning signal transmitting module and a detection signal receiving and waveform shaping module. The scanning signal transmitting module is electrically coupled to the input terminals and for providing a scanning voltage signal to the input terminals. The detection signal receiving and waveform shaping module is electrically coupled to the output terminals and for receiving and processing a plurality of detection signals outputted from the respective output terminals and thereby producing a plurality of processed detection signals. Wherein, the detection signal receiving and waveform shaping module includes a receiver and an impedance-matching network. The receiver is for receiving the detection signals. The impedance-matching network is for performing a waveform shaping operation applied to the detection signals to compensate the effect caused by uneven RC loading distribution in the capacitive touch panel and thereby producing the processed detection signals.

In one embodiment, the impedance-matching network includes a plurality of RC circuits independent from one another, a terminal of each of the RC circuits is electrically coupled to a predetermined potential (e.g., grounding potential), and the other terminal of the RC circuits is electrically coupled to receive a corresponding one of the detection signals.

In one embodiment, each of the RC circuits includes a resistor and a capacitor, and a resistance value and a capacitance value of each of the RC circuits are relevant with a ratio of a voltage amplitude of the corresponding one of the detection signals to a voltage amplitude of the corresponding one of the processed detection signals under the situation of the capacitive touch panel being untouched.

In one embodiment, the scanning signal transmitting module includes a transmitter and a level shifter. The transmitter is for generating an initial voltage signal, and the level shifter is for performing a level shift operation applied to the initial voltage signal and thereby producing the scanning voltage signal.

In one embodiment, the detection control circuit further includes a voltage amplifier, an analog-to-digital converter and a digital controller. The scanning signal transmitting module, the detection signal receiving and waveform shaping module and the analog-to-digital converter are subject to the control of the digital controller. The processed detection signals are amplified by the voltage amplifier and then digitalized by the analog-to-digital converter and thereby producing a plurality of digital detection signals. The digital detection signals are processed by the digital controller and then outputted as a touch detection result. Moreover, the detection control circuit can further include a charging circuit, the charging circuit being electrically coupled between the detection signal receiving and waveform shaping module and the voltage amplifier and being controlled by the digital controller.

A detection signal receiving and waveform shaping module in accordance with another embodiment of the present invention is adapted to a detection control circuit for a capacitive touch panel. The detection signal receiving and waveform shaping module is electrically coupled to a plurality of output terminals of the capacitive touch panel. The detection signal receiving and waveform shaping module includes a receiver and an impedance-matching network. The receiver is for receiving a plurality of detection signals from the output terminals. The impedance-matching network is for performing a waveform shaping operation applied to the detection signals and thereby producing a plurality of processed detection signals so that voltage amplitudes of the processed detection signals are substantially identical with one another under the situation of the capacitive touch panel being untouched. Moreover, the impedance-matching network can include a plurality of RC circuits independent from one another, a terminal of each of the RC circuits is electrically coupled to a predetermined potential, and the other terminal of each of the RC circuits is electrically coupled to receive a corresponding one of the detection signals. In addition, each of the RC circuits includes a resistor and a capacitor, and a resistance value and a capacitance value of each of the RC circuits are relevant with a ratio of a voltage amplitude of the corresponding one of the detection signals to a voltage amplitude of the corresponding one of the processed detection signals under the situation of the capacitive touch panel being untouched.

In the above-mentioned embodiments of the present invention, an impedance-matching network is added to perform impedance matching applied to the output terminals of the capacitive touch panel, so that the purpose of waveform shaping the detection signals outputted from the respective output terminals of the capacitive touch panel is achieved. Accordingly, the effect caused by uneven RC loading distribution in the capacitive touch panel associated with the prior art can be effectively improved, facilitating the digital level discrimination in the detection control circuit.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 3:
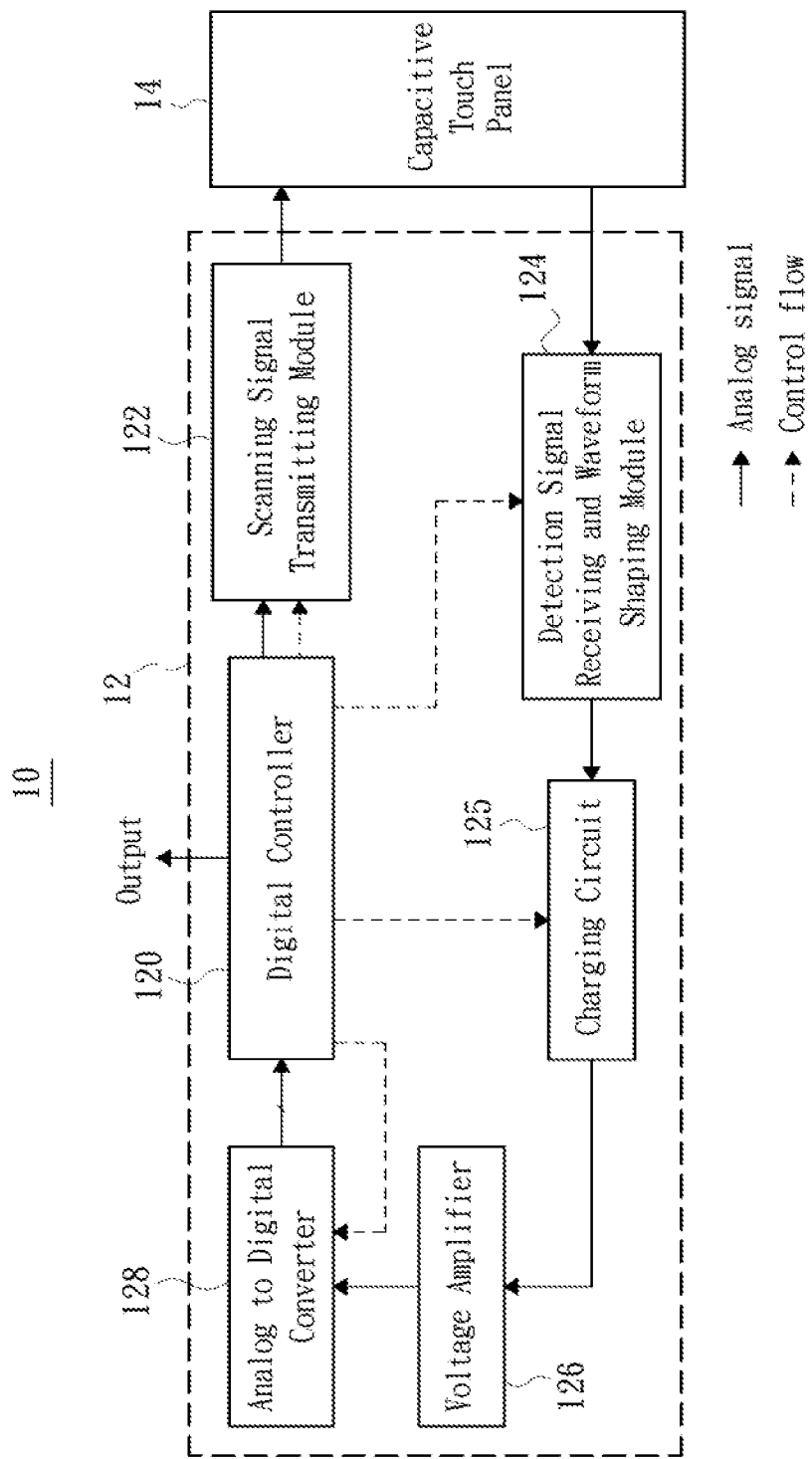
FIG. 3 shows a schematic structural diagram of a capacitive touch detection system in accordance with an embodiment of the present invention.

Referring to FIG. 3, which illustrates a schematic structural diagram of a capacitive touch detection system in accordance with an embodiment of the present invention. As illustrated in FIG. 3, the capacitive touch detection system 10 includes a detection control circuit 12 and a capacitive touch panel 14. The detection control circuit 12 includes a digital controller 120, a scanning signal transmitting module 122, a detection signal receiving and waveform shaping module 124, a charging circuit 125, a voltage amplifier 126 and an analog-to-digital (A/D) converter 128. The scanning signal transmitting module 122, the detection signal receiving and waveform shaping module 124, the charging circuit 125 and the analog-to-digital converter 128 are controlled by the digital controller 120.

Figure 4:
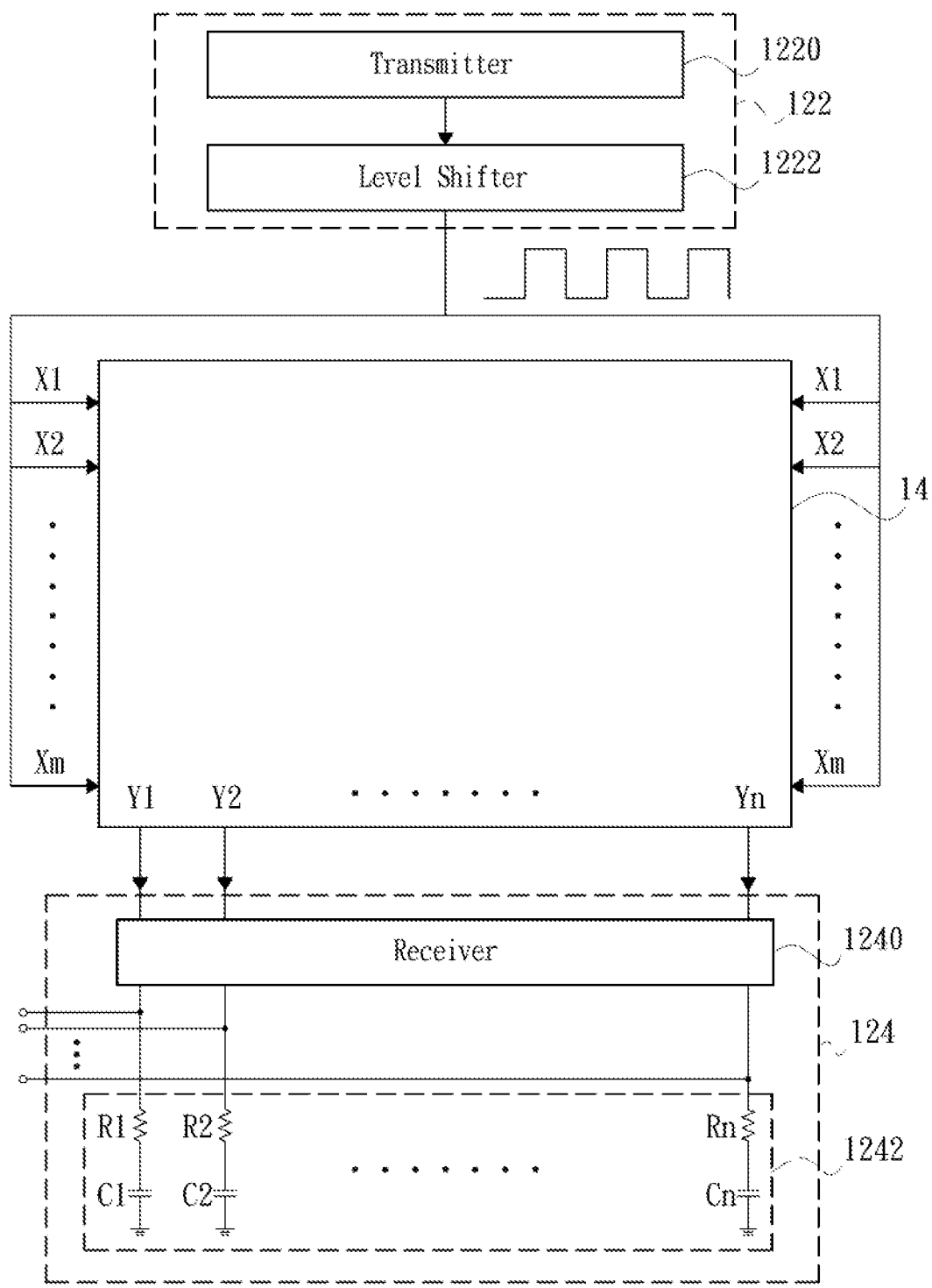
FIG. 4 shows detailed structural diagram of partial module of the capacitive touch detection system in FIG. 3.

Referring to FIGS. 3 and 4 together, FIG. 4 illustrates the detailed structural diagram of partial module of the capacitive touch detection system 10. As illustrated in FIG. 4, the capacitive touch panel 14 includes a plurality of input terminals X1~Xm and a plurality of output terminals Y1~Yn. The scanning signal transmitting module 122 is electrically coupled to the input terminals of the capacitive touch panel 14 and includes a transmitter 1220 and a level shifter 1222. An initial voltage signal generated by the transmitter 1220 is processed through the level shifter 1222 to be a scanning voltage signal (e.g., square waveform signal as illustrated in FIG. 4). The scanning voltage signal then is inputted into the input terminals X1~Xm of the capacitive touch panel in a double-side driving mode for scanning the whole capacitive touch panel 14. The detection signal receiving and waveform shaping module 124 is electrically coupled to the output terminals Y1~Yn of the capacitive touch panel 14 and includes a receiver 1240 and an impedance-matching network, for example, RC impedance-matching network 1242. The receiver 1240 receives a plurality of detection signals from the respective output terminals Y1~Yn of the capacitive touch panel 14. The RC impedance-matching network 1242 performs a waveform shaping operation applied to the detection signals outputted from the output terminals Y1~Yn and thereby producing a plurality of processed detection signals. Moreover, The RC impedance-matching network 1242 includes a plurality of RC circuits independent from one another. Each of the RC circuits includes a capacitor C1 (or one of C2~Cn) and a resistor R1 (or one of R2~Rn) connected to the capacitor in series. A terminal of each of the RC circuits is electrically coupled to a predetermined potential (e.g., grounding potential as illustrated in FIG. 4), and the other terminal of each of the RC circuits is electrically coupled to receive a corresponding one of the detection signals outputted from the respective output terminals Y1~Yn. It is indicated herein that, although FIG. 4 illustrates that the detection signals outputted from the respective output terminals Y1~Yn are firstly received by the receiver 1240 and then sent to the RC impedance-matching circuit 1242 for waveform shaping processing so that the processed detection signals are obtained, the detection signals outputted from the respective output terminals Y1~Yn can be firstly waveform shaping processed by the RC impedance-matching network 1242 to produce the processed detection signals instead, and afterward the processed detection signals are received and outputted by the receiver 1240.

Still referring to FIG. 3, the processed detection signals outputted from the detection signal receiving and waveform shaping module 124 are sent to the charging circuit 125 and amplified by the voltage amplifier 126 and then digitalized by the analog-to-digital converter 128. Consequently, a plurality of digital detection signals are obtained. The digital detection signals are inputted into the digital controller 120 and processed to be a touch detection result as output. Optionally, the detection signal receiving and waveform shaping module 124 is electrically coupled to the charging circuit 125 through a multiplexer (not shown).

Moreover, for the case of the scanning voltage signal being inputted into the input terminals X1~Xm of the capacitive touch panel 14 in the double-side driving mode, a compensation rule of the RC impedance-matching network 1242 is that: the more near to the two sides of the capacitive touch panel 14, the larger of a compensation value for RC loading. In other words, the shorter of a transmission path of the scanning voltage signal, the larger of the compensation values for RC loading. More specifically, a resistance value and a capacitance value of each of the RC circuits are relevant to a ratio of a voltage amplitude of a corresponding one of the detection signals outputted from the respective output terminals Y1~Yn to a voltage amplitude of the corresponding one of the processed detection signals under the situation of the capacitive touch panel 14 being untouched. In particular, in order to achieve the purpose of the voltage amplitudes of the processed detection signals being approximately identical with one another after waveform shaping processing, a cut-off frequency f0 of each of the RC circuits satisfies the condition that: $f0=f/(Vi/V0)$, where f is a frequency of the scanning voltage signal inputted into the input terminals X1~Xm, Vi is a voltage amplitude of the detection signal outputted from the ith one of the output terminals Y1~Yn under the situation of the capacitive touch panel 14 being untouched, V0 is a voltage amplitude of the processed detection signals under the situation of the capacitive touch panel 14 being untouched. Since $f0=1/(2\pi RiCi)$, then $RiCi=(Vi/V0)/(2\pi f)$.

Figure 1:
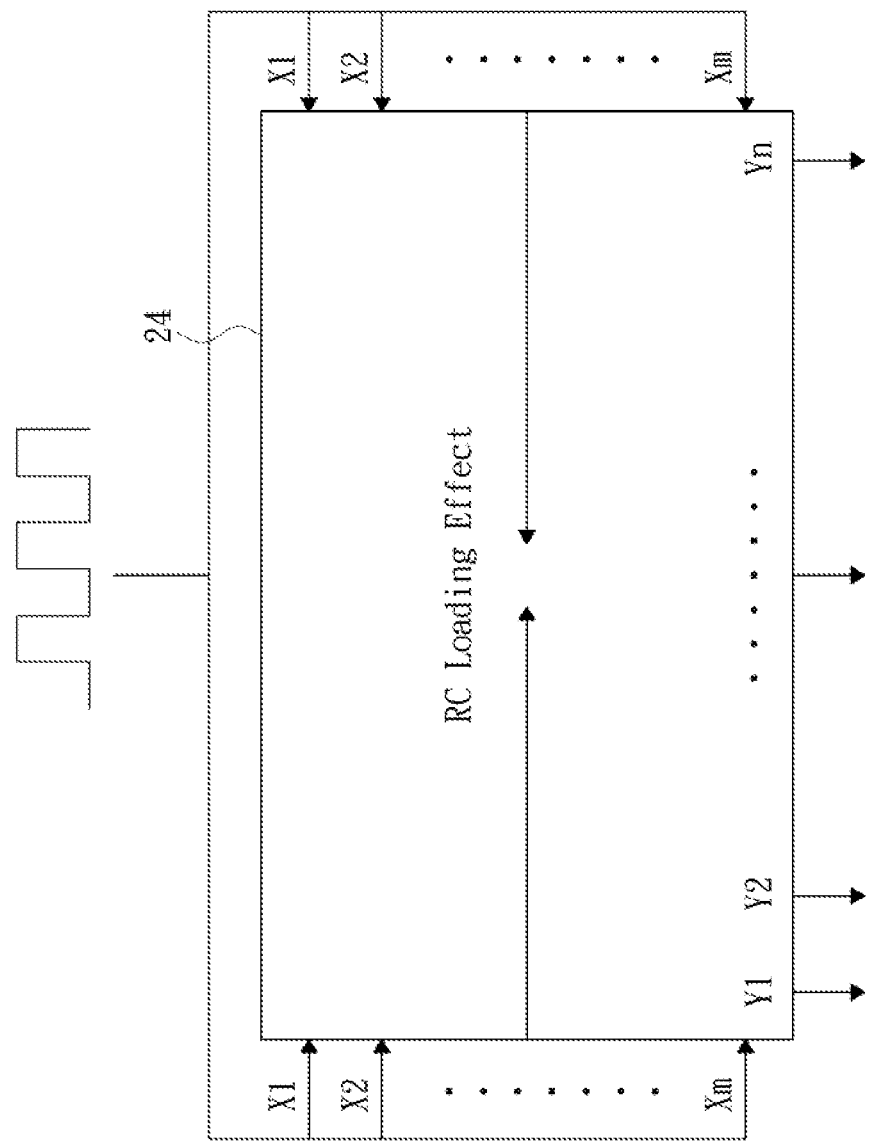
FIG. 1 shows a schematic structural diagram of a conventional capacitive touch panel.
Figure 2:
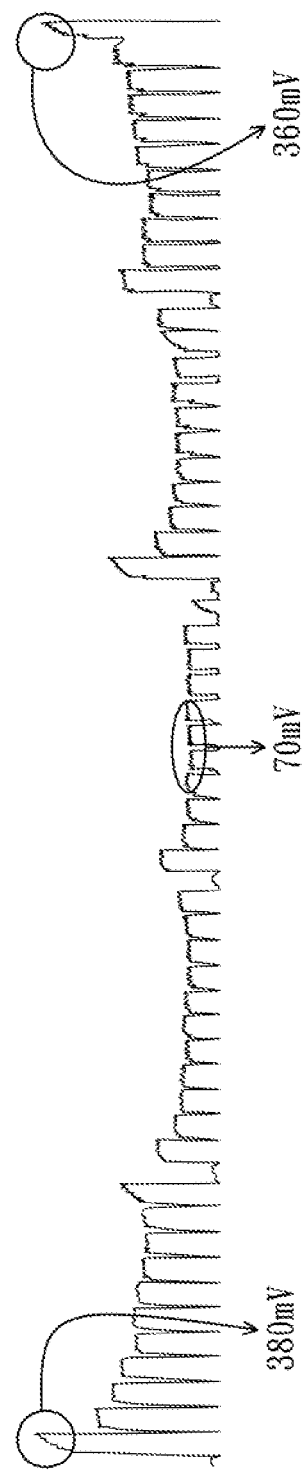
FIG. 2 shows waveforms of a plurality of detection voltages outputted from respective output terminals of the capacitive touch panel in FIG. 1 being untouched.

An example is illustrated as follows. Turning back to FIG. 2, assuming the voltage amplitude of the processed detection signals under the situation of the capacitive touch panel 14 being untouched is 70 mV (i.e., V0=70 mV) and the frequency f of the scanning voltage signal is 600 Kilohertzs (KHZ), for the case of the voltage amplitude of the detection signal outputted from the output terminal Y1 at the left-most side of the capacitive touch panel 14 being 380 mV, $R1C1=(V1/V0)/(2\pi f)=(380/70)/(2\pi*600 \text{ KHZ}) \approx 110 \text{ KHZ}/2\pi$. In regard to resistances and capacitances of the respective other RC circuits, the calculation methods thereof are the same of the above-mentioned calculation method associated with R1C1, and thus they will not be repeated herein. It is noted that the voltage amplitude of the processed detection signals under the situation of the capacitive touch panel 14 being untouched is not limited to be set as the minimum voltage amplitude (e.g., 70 mV as illustrated in FIG. 2) of the output terminals Y1~Yn, and can be set as lower than the minimum voltage amplitude.

In the above-mentioned embodiment, the scanning voltage signal is not limited to be inputted into the input terminals X1~Xm of the capacitive touch panel 14 in the double-side driving mode, and can be inputted into the input terminals X1~Xm of the capacitive touch panel 14 in a single-side driving mode, while the compensation rule of the RC impedance-matching network still is that: the shorter of a transmission path of the scanning voltage signal, the larger of the compensation value for RC loading.

In summary, in the above-mentioned embodiment of the present invention, an impedance-matching network is added to perform impedance matching applied to the output terminals of the capacitive touch panel, so that the purpose of waveform shaping the detection signals outputted from the respective output terminals of the capacitive touch panel is achieved. Accordingly, the effect caused by uneven RC loading distribution in the capacitive touch panel associated with the prior art can be effectively improved, facilitating the digital level discrimination in the detection control circuit.

Additionally, the skilled person in the art can make some modifications with respect to the capacitive touch detection system in accordance with the above-mentioned embodiment, for example, omitting the charging circuit and thereby the detection signal receiving and waveform shaping module is directly electrically coupled to the voltage amplifier, suitably changing the circuit configuration of the impedance-matching network as long as the predetermined compensation effect can be achieved, and so on.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A capacitive touch detection system comprising:
   a capacitive touch panel including a plurality of input terminals and a plurality of output terminals; and
   a detection control circuit including a scanning signal transmitting module and a detection signal receiving and waveform shaping module, the scanning signal transmitting module being electrically coupled to the input terminals for providing a scanning voltage signal to the input terminals, the detection signal receiving and waveform shaping module being electrically coupled to the output terminals for receiving and processing a plurality of detection signals outputted from the respective output terminals to produce a plurality of processed detection signals;
   wherein the detection signal receiving and waveform shaping module comprises a receiver for receiving the detection signals and an impedance-matching network for performing a waveform shaping operation applied to the detection signals thereby producing the plurality of processed detection signals, the impedance-matching network comprises a plurality of RC circuits independent from one another, a terminal of each of the RC circuits is electrically coupled to a predetermined potential, the other terminal of each of the RC circuits is electrically coupled to receive a corresponding one of the detection signals, each of the RC circuits comprises a resistor and a capacitor, and a resistance value and a capacitance value of each of the RC circuits are relevant with a ratio of a voltage amplitude of the corresponding one of the detection signals to a voltage amplitude of the corresponding one of the processed detection signals under the situation of the capacitive touch panel being untouched.

2. The capacitive touch detection system as claimed in claim 1, wherein the scanning signal transmitting module comprises a transmitter for generating an initial voltage signal and a level shifter for performing a level shift operation applied to the initial voltage signal thereby producing the scanning voltage signal.

3. The capacitive touch detection system as claimed in claim 1, wherein the detection control circuit further comprises a voltage amplifier, an analog-to-digital converter and a digital controller for controlling the scanning signal transmitting module, the detection signal receiving and waveform shaping module and the analog-to-digital converter, the processed detection signals are amplified by the voltage amplifier and then digitalized by the analog-to-digital converter and thereby a plurality of digital detection signals are obtained, the digital detection signals are processed by the digital controller to be a touch detection result for output.

4. The capacitive touch detection system as claimed in claim 3, wherein the detection control circuit further comprises a charging circuit electrically coupled between the detection signal receiving and waveform shaping module and the voltage amplifier and controlled by the digital controller.

5. The detection signal receiving and waveform shaping module as claimed in claim 1, wherein a transmission path of the scanning voltage signal is shorter, a compensation value for RC loading of a corresponding RC circuit is larger.

6. A detection signal receiving and waveform shaping module adapted to a detection control circuit for a capacitive touch panel, the detection signal receiving and waveform shaping module being electrically coupled to a plurality of output terminals of the capacitive touch panel, the detection signal receiving and waveform shaping module comprising:
 a receiver for receiving a plurality of detection signals from the output terminals; and
 an impedance-matching network for performing a waveform shaping operation applied to the detection signals to produce a plurality of processed detection signals and thereby voltage amplitudes of the processed detection signals under the situation of the capacitive touch panel being untouched are substantially identical with one another, the impedance-matching network comprises a plurality of RC circuits independent from one another, a terminal of each of the RC circuits is electrically coupled to a predetermined potential, another terminal of each of the RC circuits is electrically coupled to receive a corresponding one of the detection signals, each of the RC circuits comprises a resistor and a capacitor, and a resistance value and a capacitance value of each of the RC circuits are relevant with a ratio of a voltage amplitude of the corresponding one of the detection signals to a voltage amplitude of the corresponding one of the processed detection signals under the situation of the capacitive touch panel being untouched.

7. The detection signal receiving and waveform shaping module as claimed in claim 6, wherein a transmission path of a scanning voltage signal provided to the capacitive touch panel is shorter, a compensation value for RC loading of a corresponding RC circuit is larger.

* * * * *